United States Patent
Cheng et al.

(10) Patent No.: US 10,256,231 B2
(45) Date of Patent: *Apr. 9, 2019

(54) FORMING VERTICAL TRANSISTORS AND METAL-INSULATOR-METAL CAPACITORS ON THE SAME CHIP

(71) Applicant: INTERNATIONAL BUSINESS MACHINES CORPORATION, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/825,614

(22) Filed: Nov. 29, 2017

(65) Prior Publication Data
US 2018/0204833 A1    Jul. 19, 2018

Related U.S. Application Data

(60) Continuation of application No. 15/704,088, filed on Sep. 14, 2017, now Pat. No. 9,899,373, which is a
(Continued)

(51) Int. Cl.
*H01L 27/06* (2006.01)
*H01L 49/02* (2006.01)
(Continued)

(52) U.S. Cl.
CPC .......... *H01L 27/0629* (2013.01); *H01L 28/60* (2013.01); *H01L 29/42392* (2013.01); *H01L 29/66666* (2013.01); *H01L 29/78642* (2013.01)

(58) Field of Classification Search
CPC ........... H01L 27/0629; H01L 29/78642; H01L 29/66666
See application file for complete search history.

(56) References Cited

U.S. PATENT DOCUMENTS

| 9,812,443 B1 | 11/2017 | Cheng et al. | |
|---|---|---|---|
| 2014/0264489 A1* | 9/2014 | Wong | H01L 29/785 257/288 |
| 2018/0158912 A1* | 6/2018 | Han | H01L 29/1087 |

OTHER PUBLICATIONS

Kangguo Cheng, et al., "Forming Vertical Transistors and Metal-Insulator-Metal Capacitors on the Same Chip" U.S. Appl. No. 15/704,088, filed Sep. 14, 2017.
(Continued)

*Primary Examiner* — Walter H Swanson
(74) *Attorney, Agent, or Firm* — Cantor Colburn LLP; Vazken Alexanian

(57) ABSTRACT

A device with a vertical transistor and a metal-insulator-metal (MIM) capacitor on a same substrate includes a vertical transistor including a bottom source/drain, a fin channel extending vertically from the bottom source/drain to a top source/drain, and a gate arranged around the fin channel, and the gate including a dielectric layer, a gate metal, and spacers arranged on opposing sides of the gate; and a MIM capacitor including a gate arranged over the bottom source drain, the gate including a gate metal and a dielectric layer, and a metal arranged in a depression in the bottom source/drain and extending through a channel in the gate to cover the gate, the metal directly contacting the dielectric layer of the gate.

20 Claims, 14 Drawing Sheets

Related U.S. Application Data division of application No. 15/405,433, filed on Jan. 13, 2017, now Pat. No. 9,812,443.

(51) Int. Cl.
  *H01L 29/786* (2006.01)
  *H01L 29/423* (2006.01)
  *H01L 29/66* (2006.01)

(56) References Cited

OTHER PUBLICATIONS

List of IBM Patents or Patent Applications Treated as Related (Appendix P), Filed Nov. 30, 2017; 2 pages.

\* cited by examiner

FORMING VERTICAL TRANSISTORS AND METAL-INSULATOR-METAL CAPACITORS ON THE SAME CHIP

PRIORITY

This application is a continuation of and claims priority from U.S. patent application Ser. No. 15/704,088, filed on Sep. 14, 2017, entitled "FORMING VERTICAL TRANSISTORS AND METAL-INSULATOR-METAL CAPACITORS ON THE SAME CHIP," which is a division of and claims priority from U.S. patent application Ser. No. 15/405,433, filed on Jan. 13, 2017, entitled "FORMING VERTICAL TRANSISTORS AND METAL-INSULATOR-METAL CAPACITORS ON THE SAME CHIP," the entire contents of both applications are incorporated herein by reference.

BACKGROUND

Embodiments of the present invention relate to complementary metal oxide semiconductor (CMOS) technology, and more specifically, to fabrication methods and resulting structures for forming vertical transistors and metal-insulator-metal (MIM) capacitors on the same chip.

CMOS technology is used to construct integrated circuits such as microprocessors, microcontrollers, static random access memory (RAM) and other digital logic circuits. A basic component of CMOS designs is metal oxide semiconductor field effect transistors (MOSFETs). As MOSFETs are scaled to smaller dimensions, various designs and techniques are employed to improve device performance. Vertical transistors, in which source/drain regions are arranged on opposing ends of a vertical channel region, are attractive candidates for scaling to smaller dimensions.

SUMMARY

According to an embodiment, a method of fabricating a vertical transistor and a metal-insulator-metal (MIM) capacitor on a same substrate includes forming a first vertical transistor and a second vertical transistor on a substrate, the first vertical transistor and the second vertical transistor each including a bottom source/drain, a fin channel extending vertically from the bottom source/drain to a top source/drain, and a gate arranged around the fin channel, and the gate including a dielectric layer and a gate metal; depositing a mask on the first vertical transistor and the second vertical transistor; patterning the mask to expose the top source/drain of the second vertical transistor; removing the top source/drain, the fin channel, and a portion of the bottom source/drain of the second vertical transistor; and depositing a metal directly onto the gate of the second vertical transistor to form the MIM capacitor adjacent to the first vertical transistor, the metal directly contacting the dielectric layer of the gate and extending from the bottom source/drain, through the gate, and to a surface of the mask.

According to another embodiment, a method of fabricating a vertical transistor and a metal-insulator-metal (MIM) capacitor on a same substrate includes forming a first vertical transistor and a second vertical transistor on a substrate, the first vertical transistor and the second vertical transistor each including a bottom source/drain, a fin channel extending vertically from the bottom source/drain to a top source/drain, and a gate arranged around the fin channel, and the gate including a dielectric layer, a gate metal, and spacers arranged on top and bottom surfaces of the gate; depositing a mask on the first vertical transistor and the second vertical transistor; patterning the mask to expose the top source/drain of the second vertical transistor; removing the top source/drain, the fin channel, a portion of the bottom source/drain, and the spacers of the second vertical transistor; removing and replacing the dielectric layer of the gate of the second vertical transistor with a thicker dielectric layer; and depositing a metal directly onto the thicker dielectric layer to form the MIM capacitor adjacent to the first vertical transistor.

Yet, according to another embodiment, a device including a vertical transistor and a metal-insulator-metal (MIM) capacitor on a same substrate includes a vertical transistor including a bottom source/drain, a fin channel extending vertically from the bottom source/drain to a top source/drain, and a gate arranged around the fin channel, the gate including a dielectric layer, a gate metal, and spacers arranged on opposing sides of the gate; and a MIM capacitor including a gate arranged over the bottom source drain, the gate including a gate metal and a dielectric layer, and a metal arranged in a depression in the bottom source/drain and extending through a channel in the gate to cover the gate, the metal directly contacting the dielectric layer of the gate.

BRIEF DESCRIPTION OF THE DRAWINGS

The subject matter which is regarded as embodiments of the invention is particularly pointed out and distinctly claimed in the claims at the conclusion of the specification. The foregoing and other features, and advantages of the embodiments of the invention are apparent from the following detailed description taken in conjunction with the accompanying drawings in which:

FIGS. 1-5 illustrate an exemplary process flow for making a vertical transistor and a MIM capacitor on the same chip according to embodiments, in which:

FIG. 1 is a cross-sectional side view after patterning a mask over one of two vertical transistors arranged on the same substrate;

FIG. 2 is a cross-sectional side view after removing the top source/drain, the fin channel, and the bottom source/drain in the MIM capacitor region;

FIG. 3 is a cross-sectional side view after removing gate spacers in the MIM capacitor region;

FIG. 4 is a cross-sectional side view after depositing a metal to form the MIM capacitor according to embodiments; and FIG. 5 is a cross-sectional side view after depositing a metal to form the MIM capacitor according to embodiments;

FIGS. 6-10B illustrate an exemplary process flow for making a vertical transistor and a MIM capacitor on the same chip according to embodiments, in which:

FIG. 6 is a cross-sectional side view after patterning a mask over one of the two vertical transistors arranged on the same substrate;

FIG. 7 is a cross-sectional side view after removing the top source/drain, the fin channel, and the bottom source/drain in the MIM capacitor region;

FIG. 8 is a cross-sectional side view after removing gate spacers in the MIM capacitor region;

FIG. 9 is a cross-sectional side view after removing the thin dielectric in the MIM capacitor region;

FIG. 10B is a cross-sectional side view after depositing a thick dielectric followed by metal deposition according to embodiments;

FIGS. 11-12B illustrate an exemplary process flow for making a vertical transistor and a MIM capacitor on the same chip according to embodiments, in which:

FIG. 11 is a cross-sectional side view of a device in which one vertical transistor has a wider fin than an adjacent vertical transistor;

FIG. 12B is a cross-sectional side view after after removing the source/drains, fin, and spacers, and then depositing a thick dielectric and metal to form the MIM capacitor according to embodiments.

DETAILED DESCRIPTION

Figure 1:
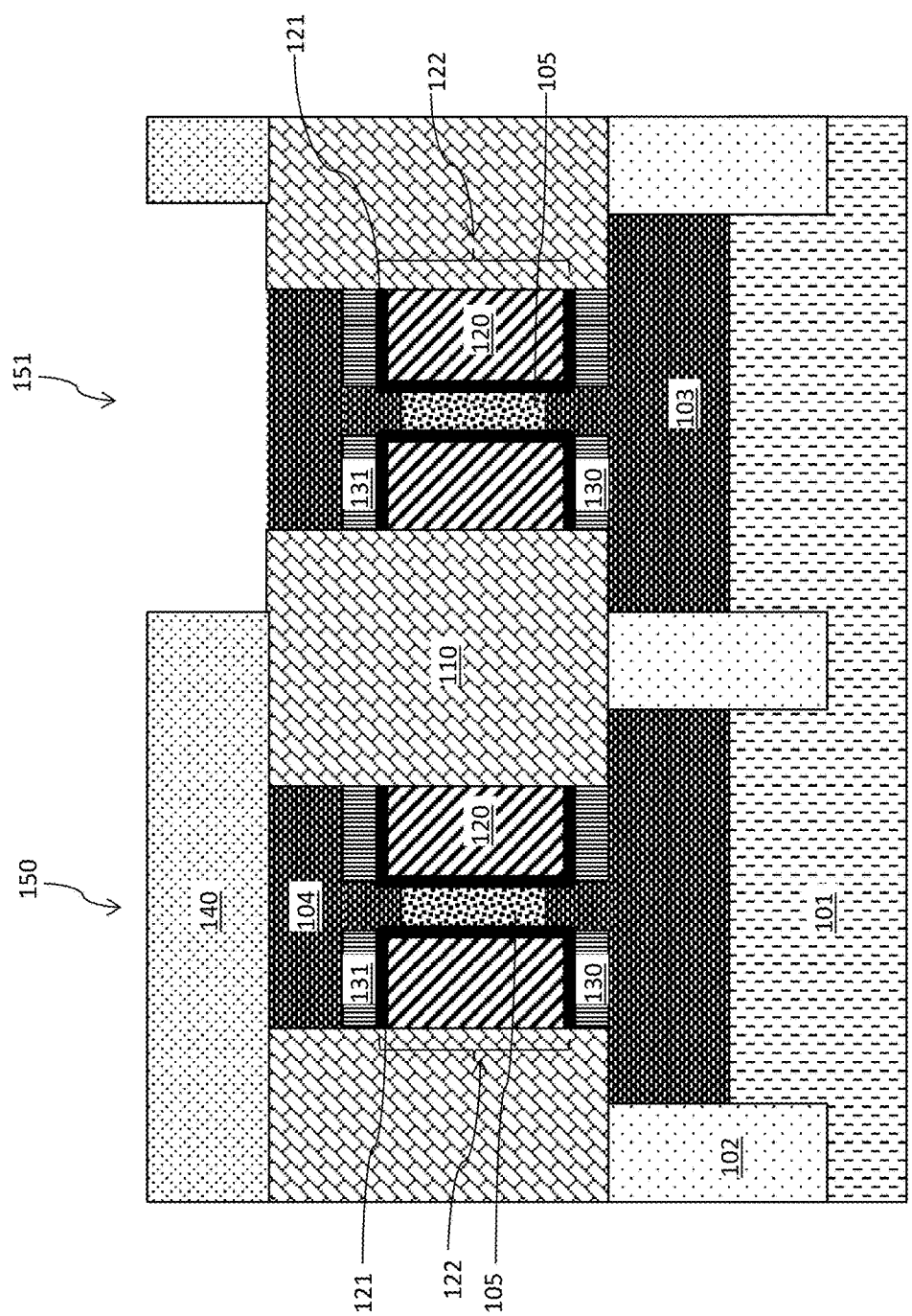

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, vertical transistors are being explored as options for 7 nm node and beyond devices. On-chip MIM capacitors are highly desired to render vertical transistors a viable technology. In many process flows, planar MIM capacitors are formed in the back-end-of-line (BEOL), and therefore occupy a large chip area. Thus, there is a need for improvement in forming MIM capacitors along with vertical transistors on the same chip.

Accordingly, described herein are process flows and resulting structures for forming a MIM capacitor along with a vertical transistor on the same chip. In embodiments, initially the MIM capacitor region and vertical transistor are formed by the same process. In other embodiments, one vertical transistor region is protected by a mask, and the top source/drain and fin channel of the MIM capacitor region is removed and replaced by metal. In embodiments, the top and bottom gate spacers in the MIM capacitor are also removed to further increase the capacitance of the MIM capacitor.

Turning now to a detailed description of aspects of the present invention, FIGS. 1-5 illustrate an exemplary process flow for making a vertical transistor and a MIM capacitor on the same chip according to embodiments. FIG. 1 is a cross-sectional side view after patterning a mask 140 over identical first and second vertical transistors 150, 151, which are arranged on the same substrate 101. After the mask 140 is patterned, the top source/drain 104 of the second transistor 151, which will be converted to the MIM capacitor, is exposed.

The substrate 101 can include one or more semiconductor materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The fins 105 can be formed in the substrate 101 by, for example, depositing and patterning a hard mask material over the substrate 101. The fins 105 can be patterned in the substrate by, for example, sidewall imaging transfer. The fins 105 extend vertically from the bottom source/drain 103 to the top source/drain 104.

Isolation regions 102, such as shallow trench isolation (STI) regions, are formed between the first transistor 150 and second transistor 151. The isolation regions 102 can be formed by any known method in the art, including, for example, lithography or etching to form trenches, and then filling the trenches with an insulating material, such as silicon dioxide. After forming isolation regions 102, an active region is defined as the region between a pair of isolation regions 102.

Bottom source/drain regions 103 (first source/drain regions) are formed in the substrate between the isolation regions 102. The bottom source/drain regions 103 can be formed by depositing an epitaxial layer onto the substrate 101. Alternatively, the bottom source/drain regions 103 can be formed by incorporating dopants into the substrate 101. Epitaxial growth can be grown using, for example, vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide.

Gates 122 are formed on bottom source/drain regions 103. Each gate 122 includes a gate stack that includes a dielectric layer 121 and a metal gate 120. The dielectric layer 121 can be a dielectric material having a dielectric constant greater than 3.9, 7.0, or 10.0, for example. Non-limiting examples of suitable materials for the dielectric layer 121 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The dielectric layer 121 can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric layer 121 can vary depending on the deposition process as well as the composition and number of dielectric materials used.

The metal gate 120 of the gate 122 includes one or more metal layers. The metal gate 120 can include a work function metal arranged on the dielectric layer 121 and a gate metal that fills the gate area. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The conductive gate metal can then be deposited on the work function metal. Non-limiting examples of suitable conductive metals include aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, and sputtering.

The gates 122 include bottom gate spacer 130 (first gate spacer) and top gate spacer 131 (second gate spacer) arranged on opposing sides of the gates 122. The bottom gate spacer 130 contacts the bottom source/drain region 103 and extends to the gate 122. The top gate spacer 131 contacts the top source/drain region 104 and extends to the gate 122.

The bottom gate spacer 130 and top gate spacer 131 can include a dielectric material. The spacer material can include silicon, nitrogen, and carbon and/or boron, oxygen. For example, the spacer material can be SiN, SiON, SiBN, SiCN, SiBCN, SiOCN, SiOC, or any combination thereof.

The top source/drain regions 104 (second source/drain regions) are formed on top of the gates 122. The top source/drain regions 104 directly contact the top gate spacer 131 and the fin 105. The top source/drain regions 104 can be formed by depositing an epitaxial layer onto the gates 122. Epitaxial growth can be grown using, for example, vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide.

An interlayer dielectric (ILD 110) is disposed on the substrate 101 and around the gates 122. The ILD 110 extends to the top of the top source/drain regions 104. The ILD 110 can be formed from, for example, a low-k dielectric material (with k<4.0), including but not limited to, silicon oxide, spin-on-glass, a flowable oxide, a high density plasma oxide, borophosphosilicate glass (BPSG), or any combination thereof. In some embodiments, the ILD 110 can further comprise a liner such as silicon nitride around the low-k dielectric material. The ILD 110 can be deposited by a deposition process, including, but not limited to CVD, PVD, plasma enhanced CVD, atomic layer deposition (ALD), evaporation, chemical solution deposition, or like processes.

The mask 140 can be, for example, a hard mask material, such as silicon nitride, or photoresist material.

Figure 2:
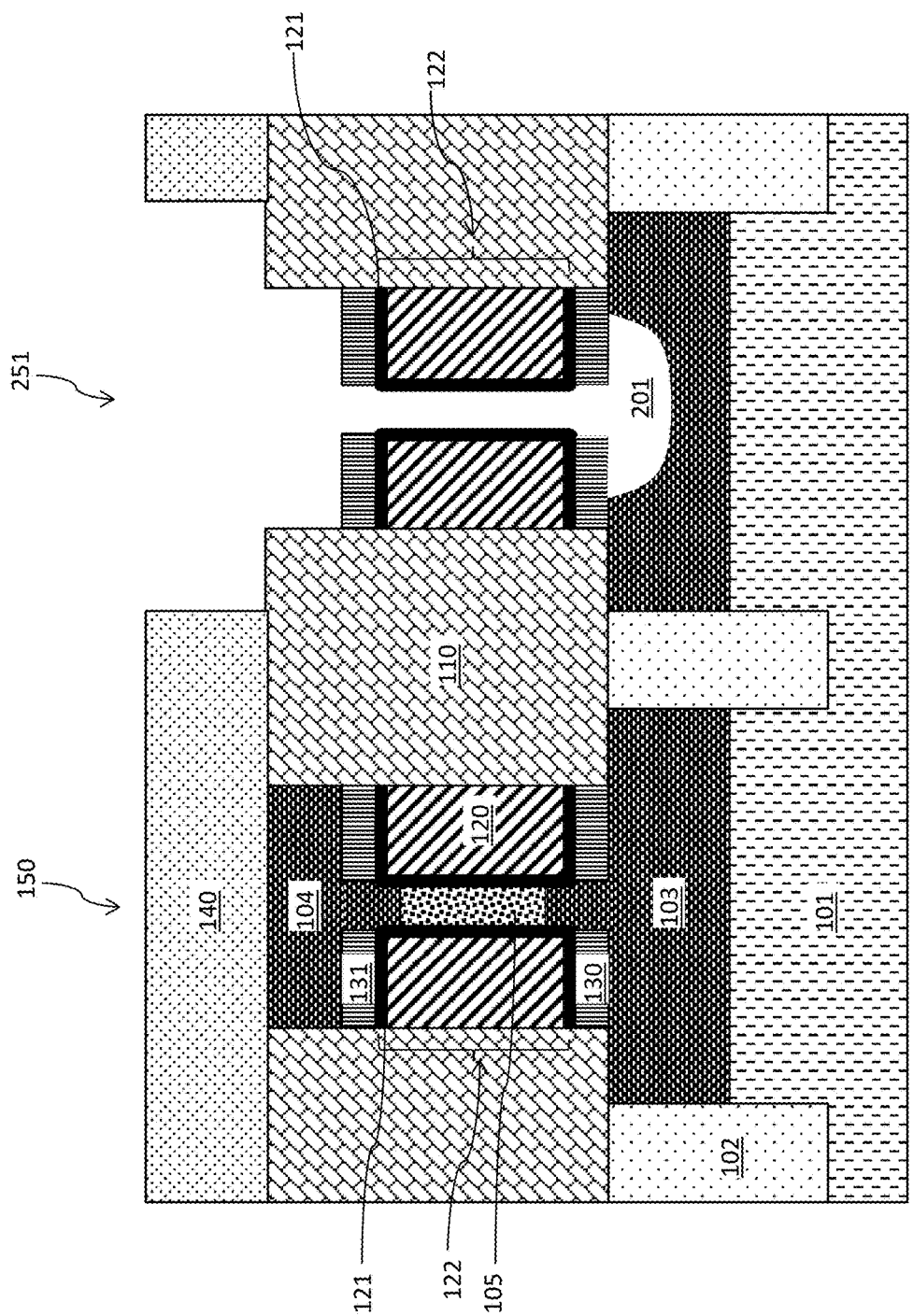

FIG. 2 is a cross-sectional side view after removing top source/drain region 104, the fin 105 (i.e., the channel), and a portion of bottom source/drain region 103 in the MIM capacitor region 251. The top source/drain region 104, fin 105, and portion of the bottom source/drain region 103 each can be removed by performing one or more semiconductor material etch process. Etching the bottom source/drain region 103 forms a depression or cavity 201 in the bottom source/drain region 103. The etch process (or processes) can be a timed semiconductor etch selective to dielectric material, such that the gate spacers and dielectric layer of the gate are not substantially etched. One or more wet and/or dry etch processes can be performed to remove the semiconductor material. Non-limiting examples of etch processes to remove the top source/drain region 104, the fin 105, and a portion of the bottom source/drain region 103 include an aqueous solution comprising ammonia, ammonia and hydroperoxide, or a dry etch comprising, for example, chlorine.

Figure 3:
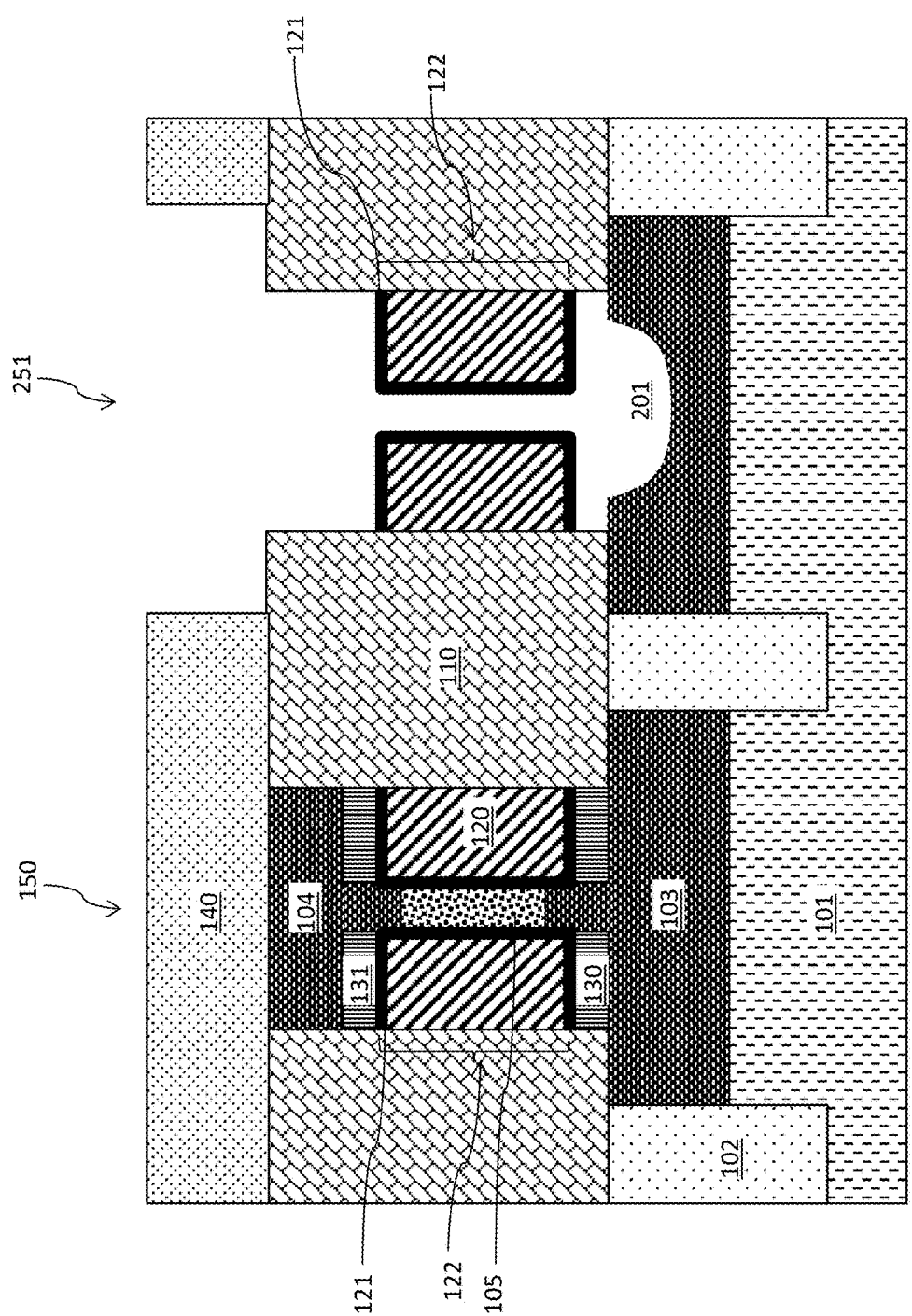

FIG. 3 is a cross-sectional side view after removing the gate spacers in the MIM capacitor region 251. The bottom gate spacer 130 and top gate spacer 131 are removed to further enhance capacitance in the MIM capacitor region 251. Removing the gate spacers increases the contact surface area. Removing the bottom gate spacer forms a gap between the gate 122 and the bottom source/drain region 103. The bottom gate spacer 130 and top gate spacer 131 can be removed by an etch process, such as a phosphoric acid etch.

Figure 4:
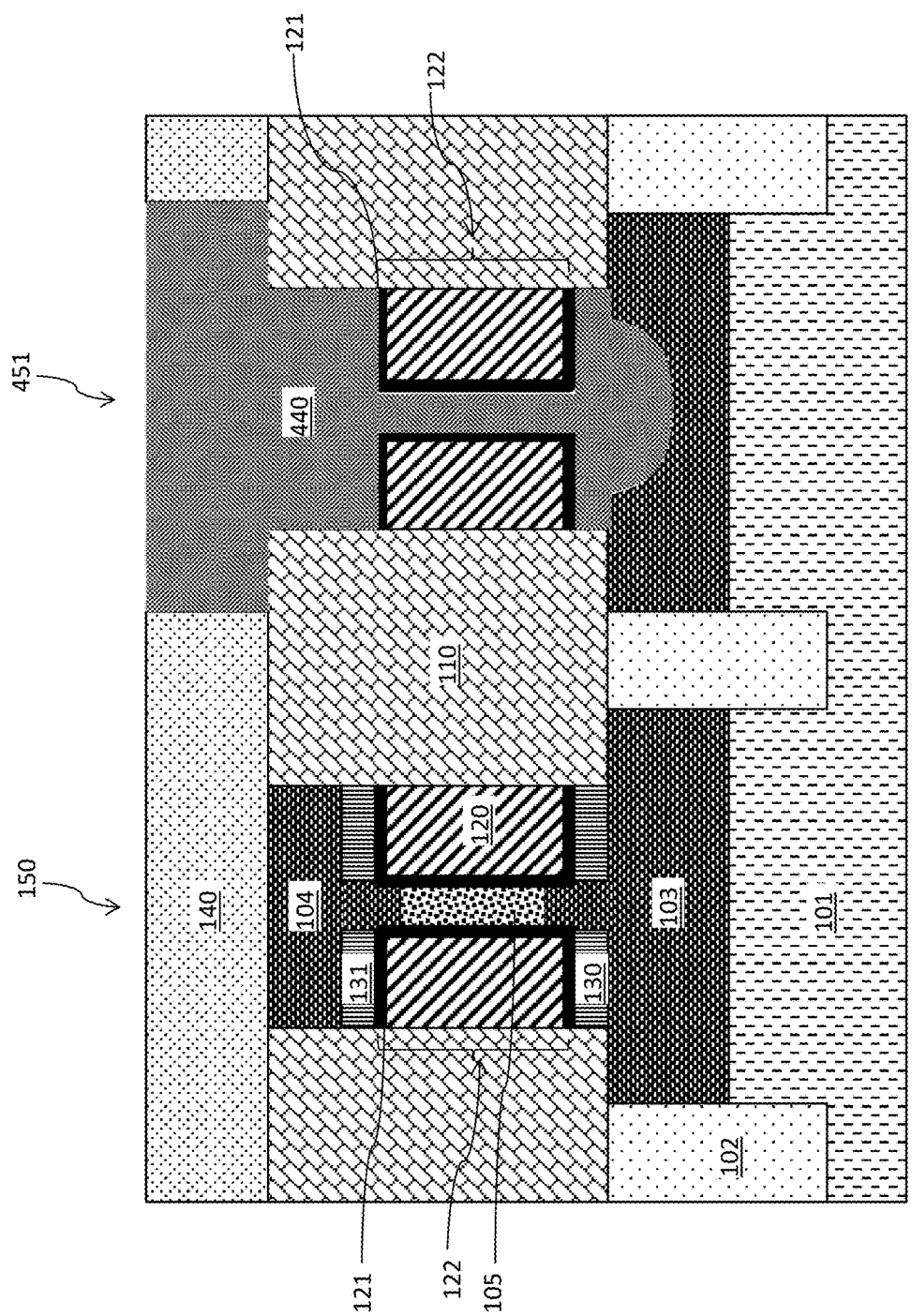

FIG. 4 is a cross-sectional side view after depositing a metal 440 to form the MIM capacitor 451 according to an embodiment. A planarization process, such as chemical mechanical planarization (CMP), is performed after depositing the metal 440. The MIM capacitor 451 (metal-insulator-metal) includes new metal 440, dielectric layer 121, and metal gate 120. The new metal 440 extends continuously from the bottom source/drain 103 and through the gate 122 to the top of the mask 140 when a bottom-up deposition process is used. The metal 440 fills the region over the gate 122 previously occupied by the top source/drain region 104. Non-limiting examples of bottom-up deposition processes include, for example, plating and physical vapor deposition (PVD).

Figure 5:
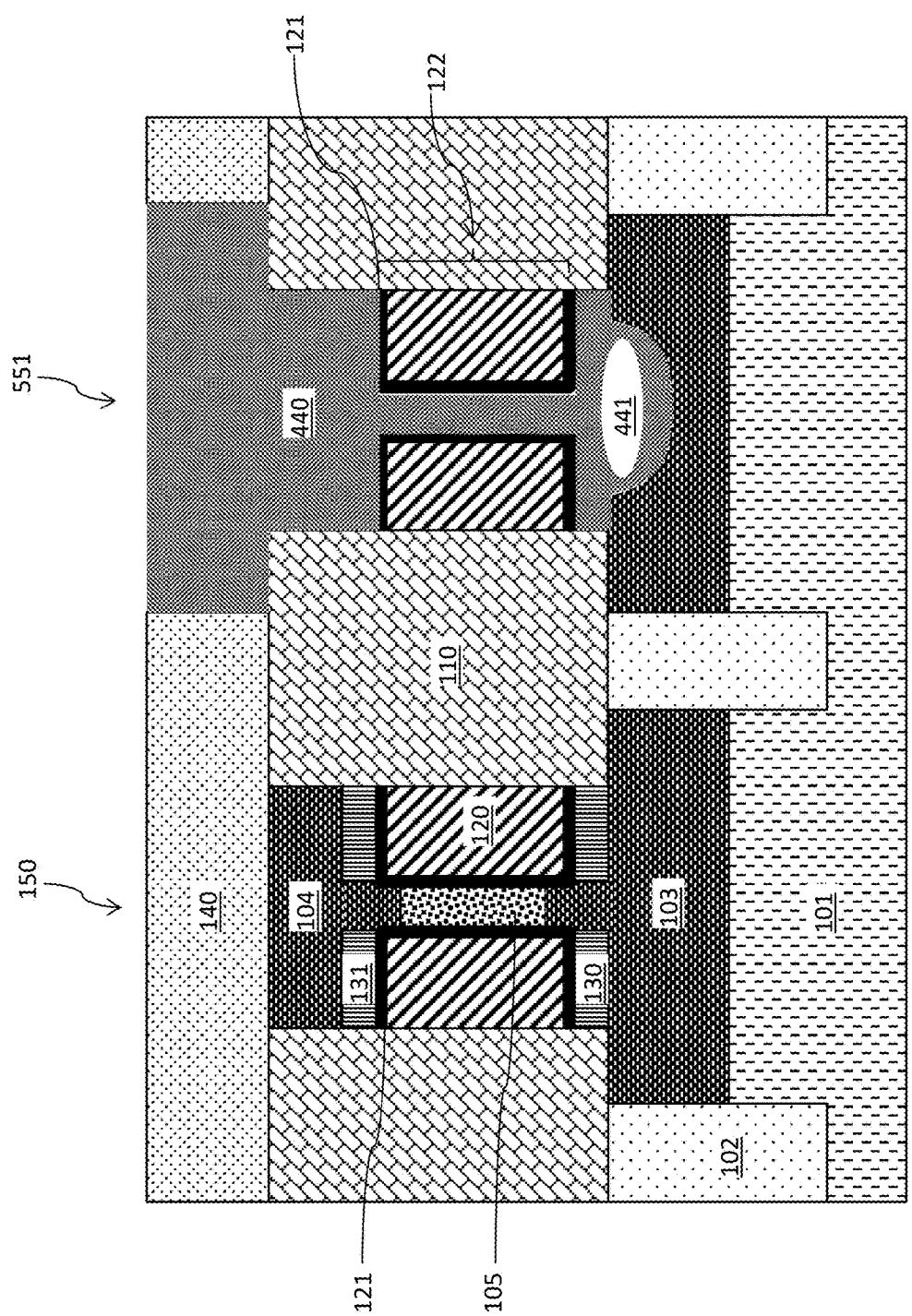

FIG. 5 is a cross-sectional side view after depositing a metal 440 to form the MIM capacitor 551 according to another embodiment. A planarization process, such as chemical mechanical planarization (CMP), is performed after depositing the metal 440. The MIM capacitor 551 (metal-insulator-metal) includes the new metal 440, dielectric layer 121, and the metal gate 120. Non-limiting examples of metals 440 include aluminum (Al), platinum (Pt), gold (Au), tungsten (W), titanium (Ti), or any combination thereof.

Instead of a bottom-up deposition process, as shown in FIG. 4, a conformal deposition process forms the void 441 beneath the previously removed fin channel area and gate 122. The void 441 does not affect functioning of the MIM capacitor 551. Non-limiting examples of conformal deposition processes include chemical vapor deposition (CVD) and atomic layer deposition (ALD).

Other embodiments are now described with reference to FIGS. 6-10B, which illustrate an exemplary process flow for making a vertical transistor and a MIM capacitor on the same chip when a high voltage MIM capacitor is needed. In the following process flow and description, the gate dielectric layer in the MIM capacitor region is replaced with a thicker dielectric material. The resulting dielectric layer, for example a high-k dielectric layer, is thicker in the MIM capacitor region compared to the adjacent vertical transistor on the same chip.

Figure 6:
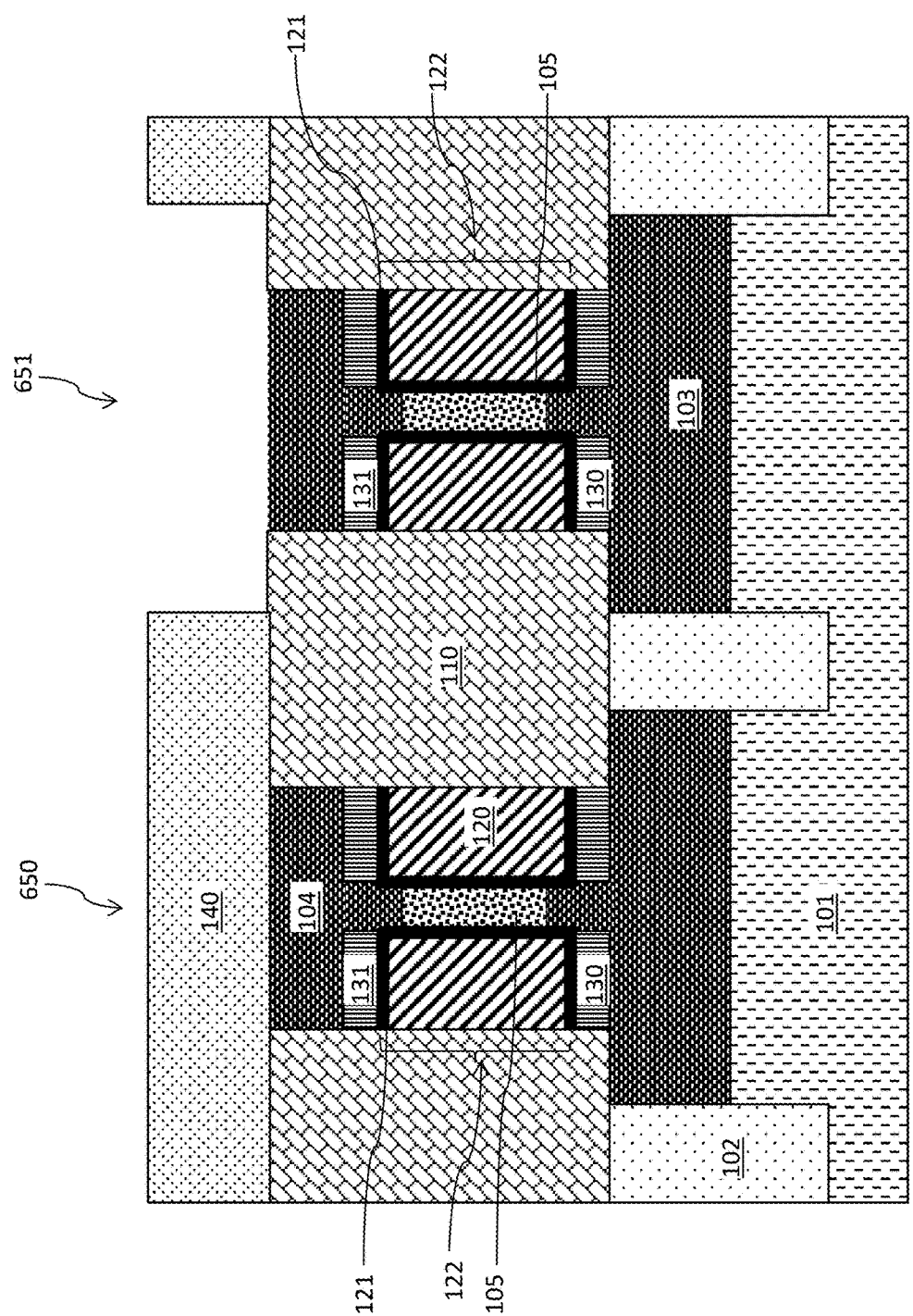

FIG. 6 is a cross-sectional side view after patterning a mask 140 over one of the two vertical transistors arranged on the same substrate 101. As shown, identical vertical transistors (first transistor 650 and second transistor 651) are formed on the same substrate 101. The mask 140 is patterned to expose one of the two transistors, such as second transistor 651 as shown. Second transistor 651 will be converted into the MIM capacitor in subsequent processing steps. Other details for forming the structure shown in FIG. 6 are described above with reference to FIG. 1.

Figure 7:
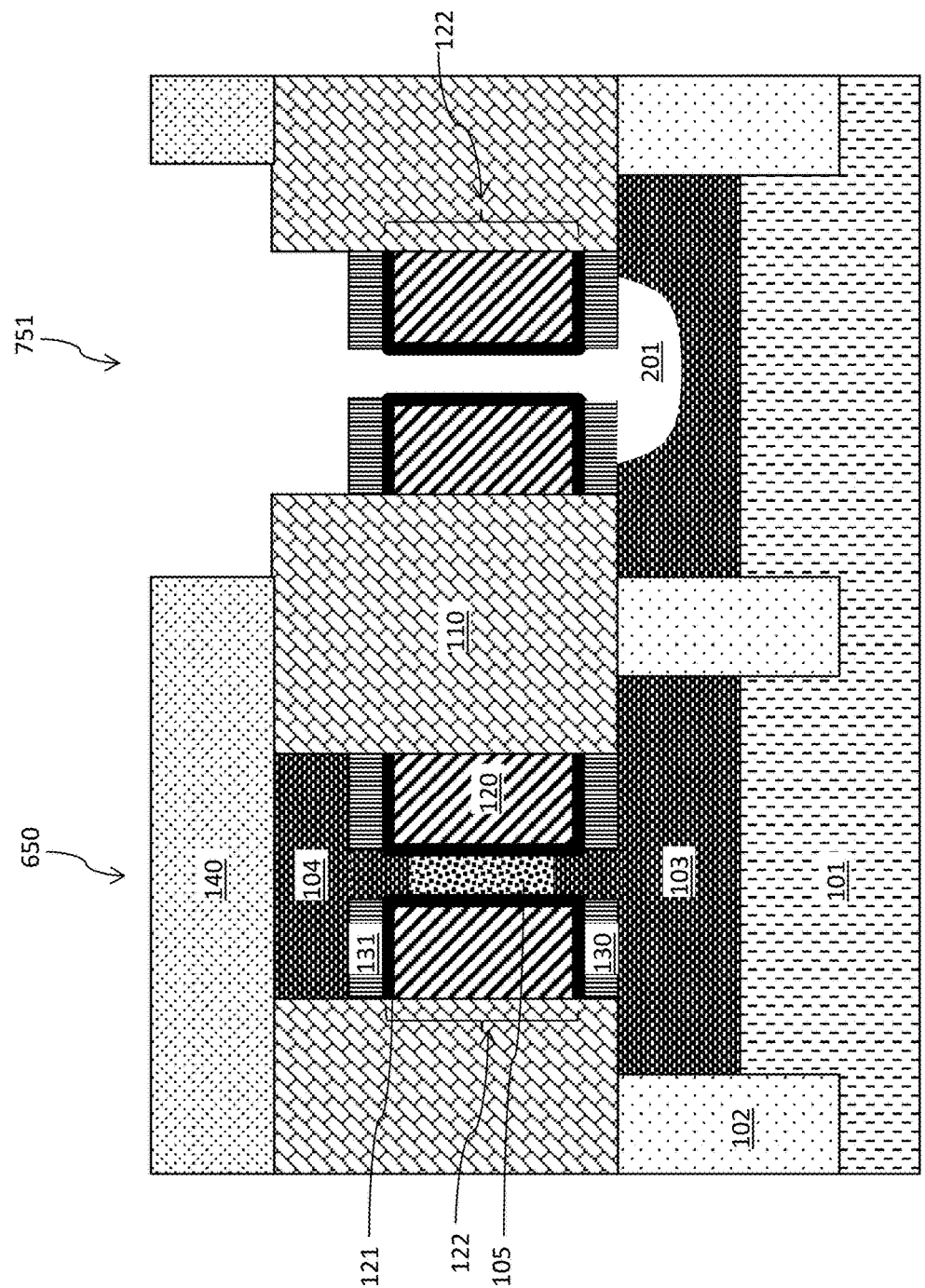

FIG. 7 is a cross-sectional side view after removing top source/drain region 104, the fin 105 (i.e., the channel), and a portion of bottom source/drain region 103 in the MIM capacitor region 751. The top source/drain region 104, fin 105, and portion of the bottom source/drain region 103 each can be removed by performing a semiconductor material etch process. Etching the bottom source/drain region 103 forms a depression or cavity 201 in the bottom source/drain region 103. The etch process (or processes) can be a timed semiconductor etch selective to dielectric material, such that the gate spacers and dielectric layer of the gate are not substantially etched. Other details for forming the structure shown in FIG. 7 are described above with reference to FIG. 2.

Figure 8:
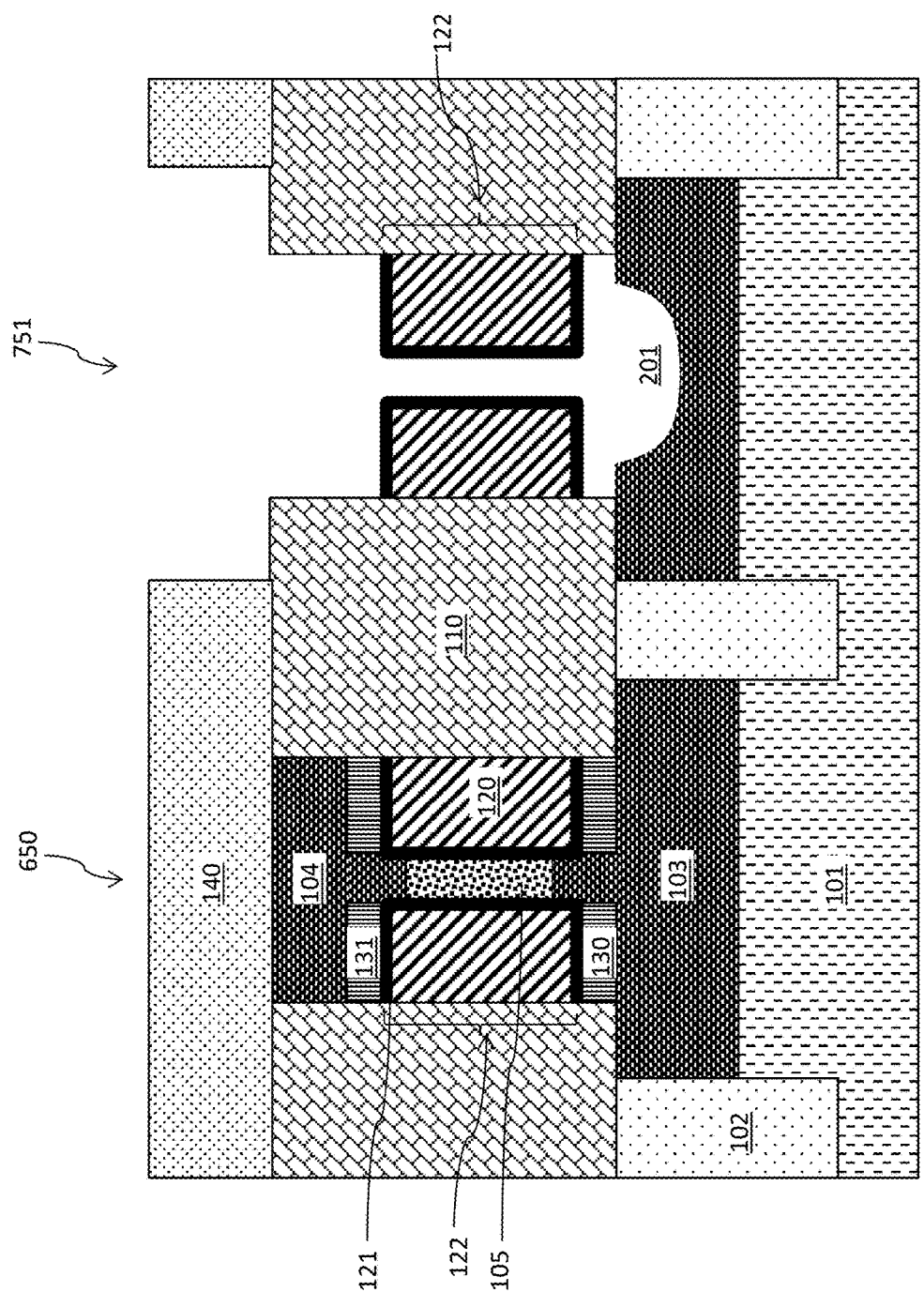

FIG. 8 is a cross-sectional side view after removing gate spacers in the MIM capacitor region 751. The bottom gate spacer 130 and top gate spacer 131 are removed to further enhance capacitance in the MIM capacitor region. Removing the gate spacers increases the contact surface area. Removing the bottom gate spacer forms a gap between the gate 122 and the bottom source/drain region 103. Other details for forming the structure shown in FIG. 8 are described above with reference to FIG. 3.

Figure 9:
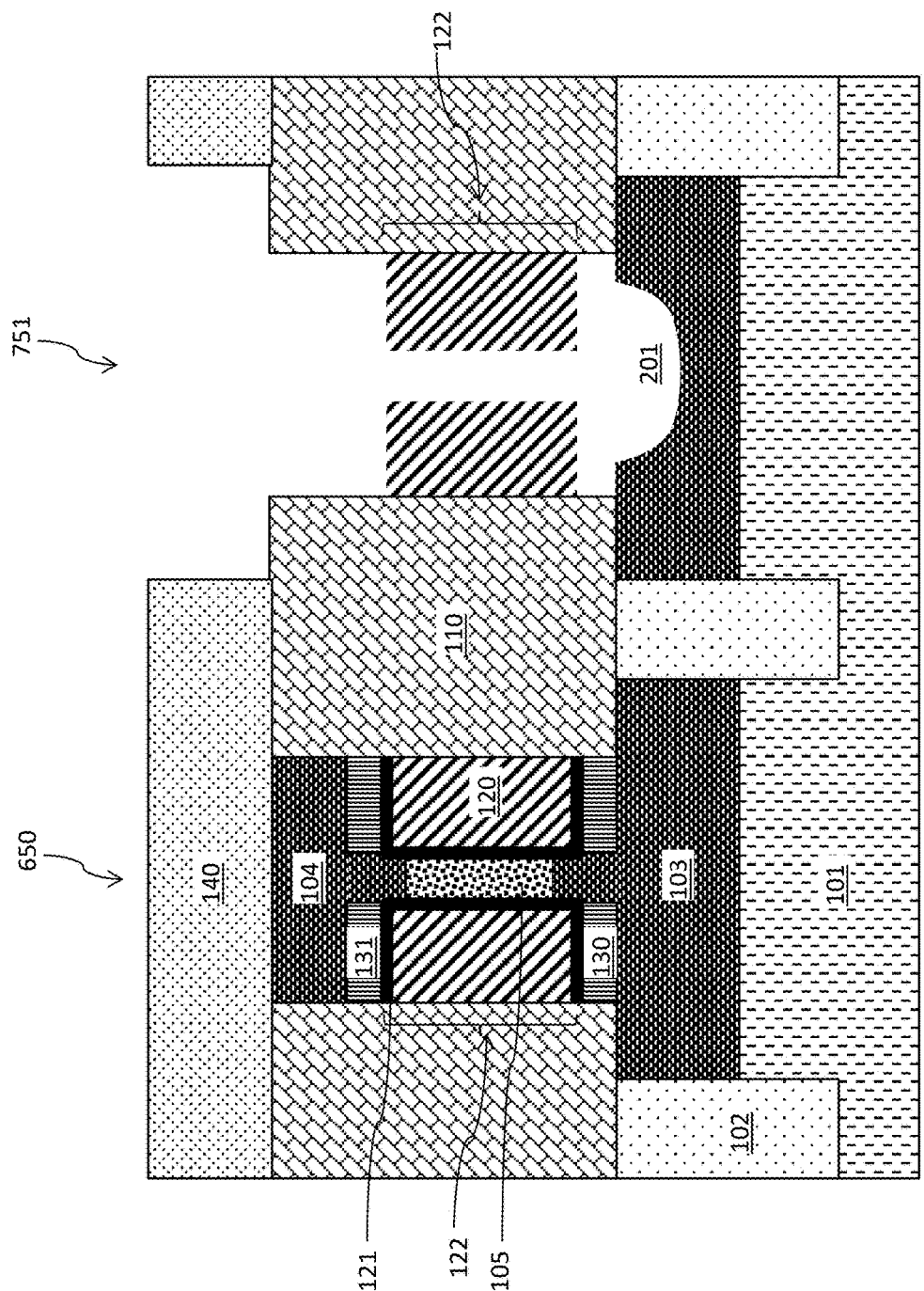

FIG. 9 is a cross-sectional side view after removing the dielectric layer 121 in the MIM capacitor region 751. In exemplary embodiments, the dielectric layer 121 is a high-k dielectric layer. Removing the dielectric layer 121 exposes the metal gate 120. The dielectric layer 121 can be removed by performing an etch process, for example, an etch process comprising dilute hydrofluoric acid (HF) solutions when the dielectric layer 121 comprises hafnium oxide.

Figure 10A:
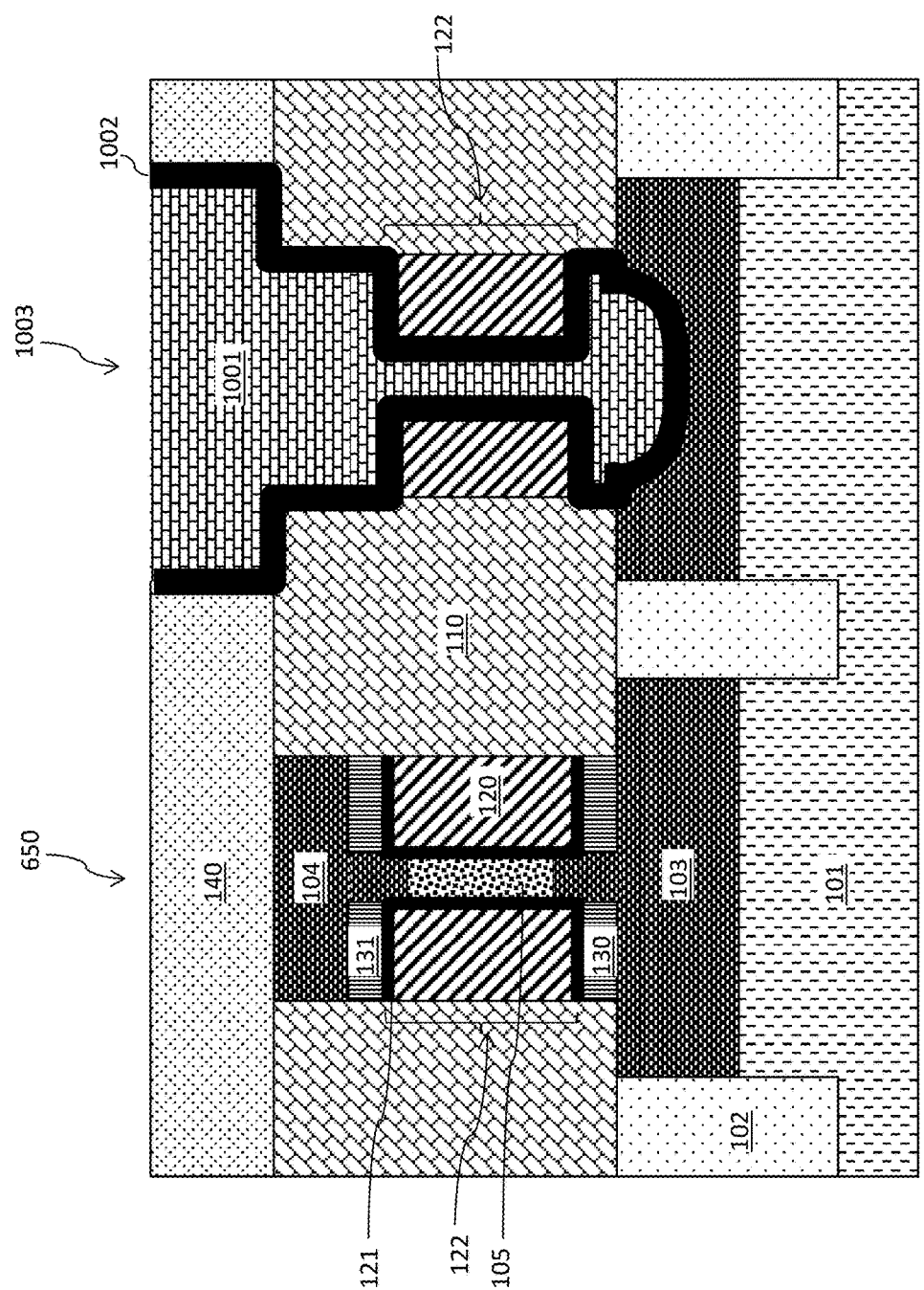
FIG. 10A is a cross-sectional side view after depositing a thick dielectric followed by metal deposition according to embodiments.

FIG. 10A is a cross-sectional side view after depositing a thick dielectric layer 1002 followed by metal deposition of metal 1001 to form MIM capacitor 1003 according to an embodiment. The thin dielectric layer in the MIM capacitor region 1003 is replaced with a thicker dielectric layer. The MIM capacitor 1003 (metal-insulator-metal) includes new metal 1001, thick dielectric layer 1002, and metal gate 120. In embodiments, the thick dielectric layer 1002 is a high-k dielectric material layer. The thick dielectric layer 1002 of the MIM capacitor 1003 can be the same material or a different material than the dielectric layer 121 of first transistor 650. The thick dielectric layer 1002 lines all exposed surfaces of the gate 122, depression within the bottom source/drain region 103, and the ILD 110. The thick dielectric layer 1002 can include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The thick dielectric layer 1002 can further include dopants, such as lanthanum or aluminum.

The thick dielectric layer 1002 can be formed using deposition processes, for example, CVD, ALD, ion beam deposition, electron beam deposition, laser assisted deposition, chemical solution deposition, or any combination of those methods.

The thickness of dielectric layer 1002 of the MIM capacitor 1003 is greater than the thickness of the dielectric layer 121 of the adjacent vertical transistor. In exemplary embodiments, the thickness of the thin dielectric layer 121 of the first transistor 650 is in a range from about 1 nm to about 6 nm. In other embodiments, the thickness of the thin dielectric layer 121 of the first transistor 650 is in a range from about 2 nm to about 3 nm. In exemplary embodiments, the thickness of the thick dielectric layer 1002 of the MIM capacitor 1003 is in a range from about 2 nm to about 15 nm. In exemplary embodiments, the thickness of the thick dielectric layer 1002 of the MIM capacitor 1003 is in a range from about 4 nm to about 6 nm.

After forming the thick dielectric layer 1002, the new metal 1001 is deposited directly on the thick dielectric layer 1002. The new metal 1001 can be deposited by any bottom-up deposition process, for example, as described with reference to FIG. 4. A planarization process, such as chemical mechanical planarization (CMP), is performed after depositing the metal 1001. The new metal 1001 extends from the bottom source/drain 103 to the top of the mask 140 when a bottom-up deposition process is used. Non-limiting examples of metals 1001 include aluminum (Al), platinum (Pt), gold (Au), tungsten (W), titanium (Ti), or any combination thereof.

Figure 10B:
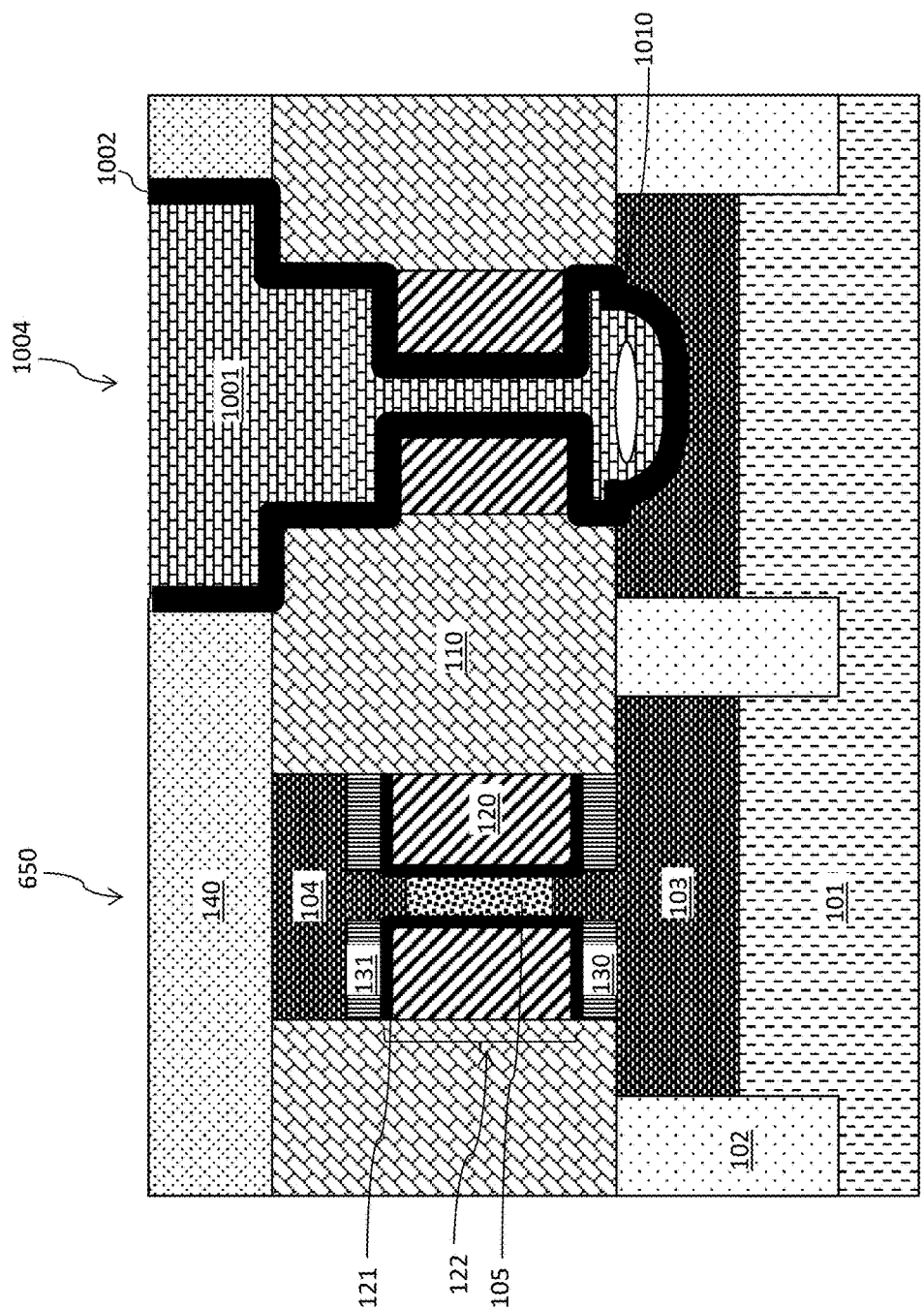

FIG. 10B is a cross-sectional side view after depositing a thick dielectric layer 1002 followed by metal deposition of metal 1001 to form MIM capacitor 1004 according to another embodiment. A planarization process, such as chemical mechanical planarization (CMP), is performed after depositing the metal 1001. The MIM capacitor 1004 (metal-insulator-metal) includes the new metal 1001, thick dielectric layer 1002, and the metal gate 120. Instead of a bottom-up deposition process, as shown in FIG. 10A, a conformal deposition process forms the void 1010 beneath the previously removed fin channel area and gate 122. The void 1010 does not affect functioning of the MIM capacitor 1004.

Figure 11:
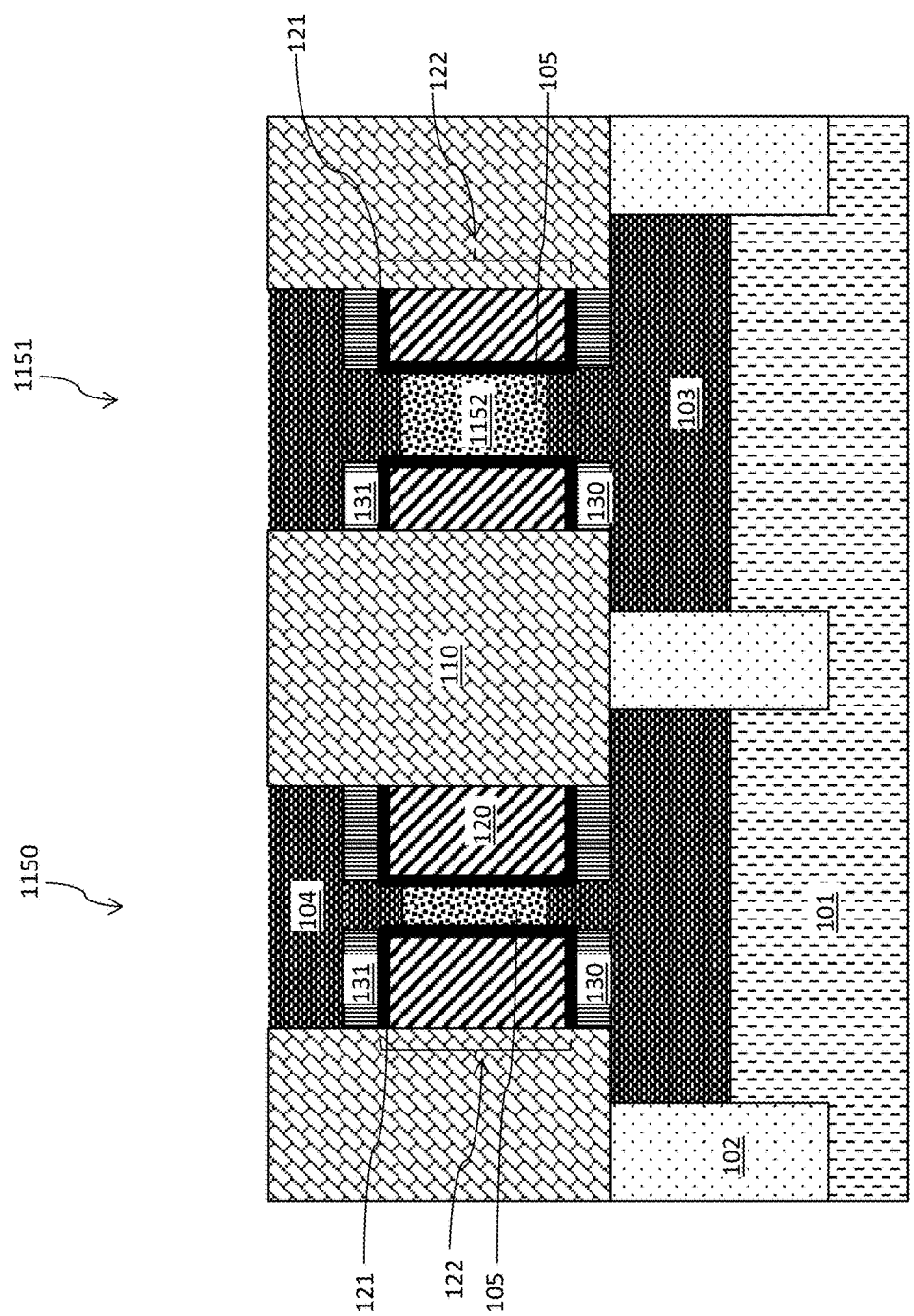
Figure 12A:
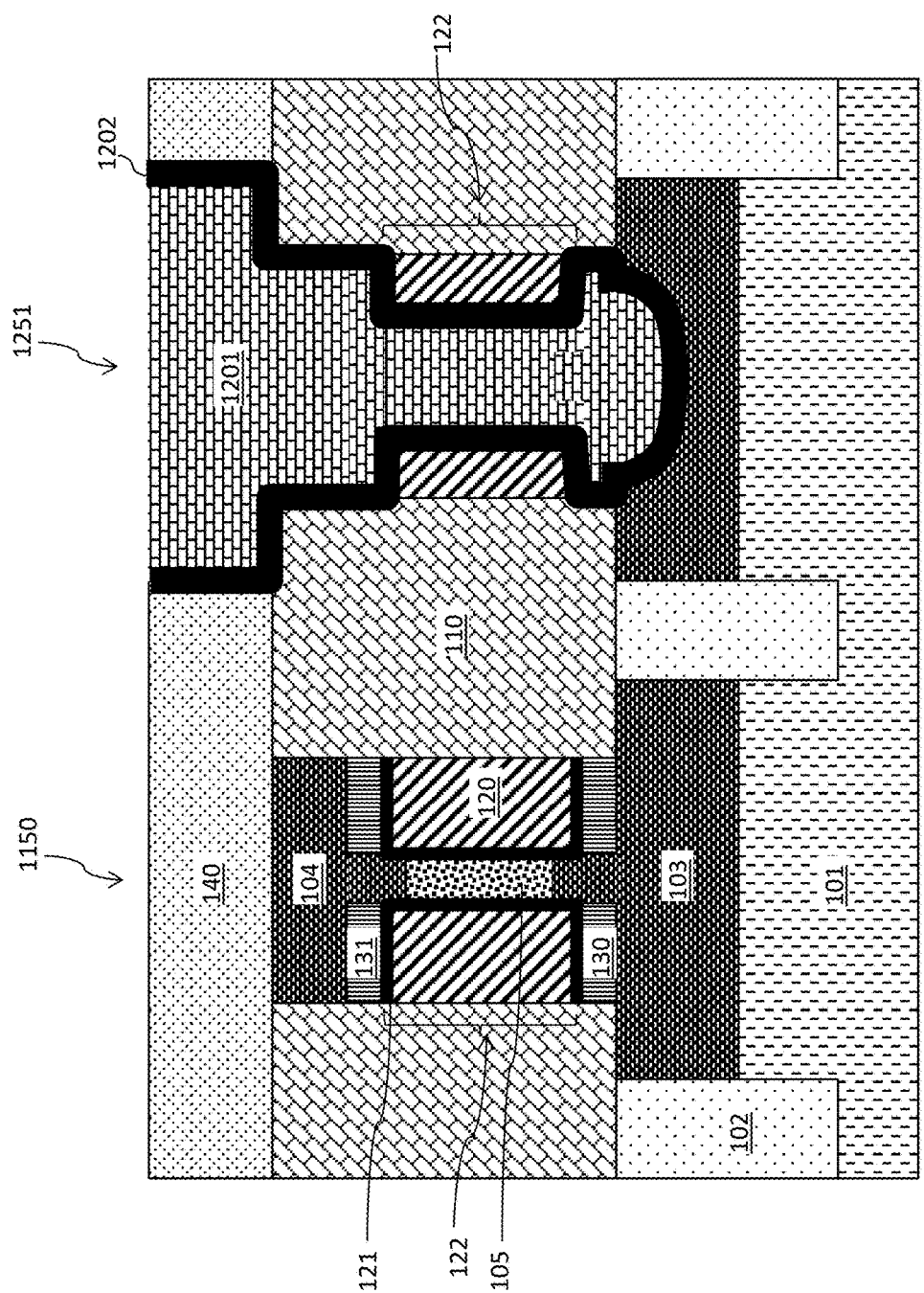
FIG. 12A is a cross-sectional side view after removing the source/drains, fin, and spacers, and then depositing a thick dielectric and metal to form the MIM capacitor according to embodiments.
Figure 12B:
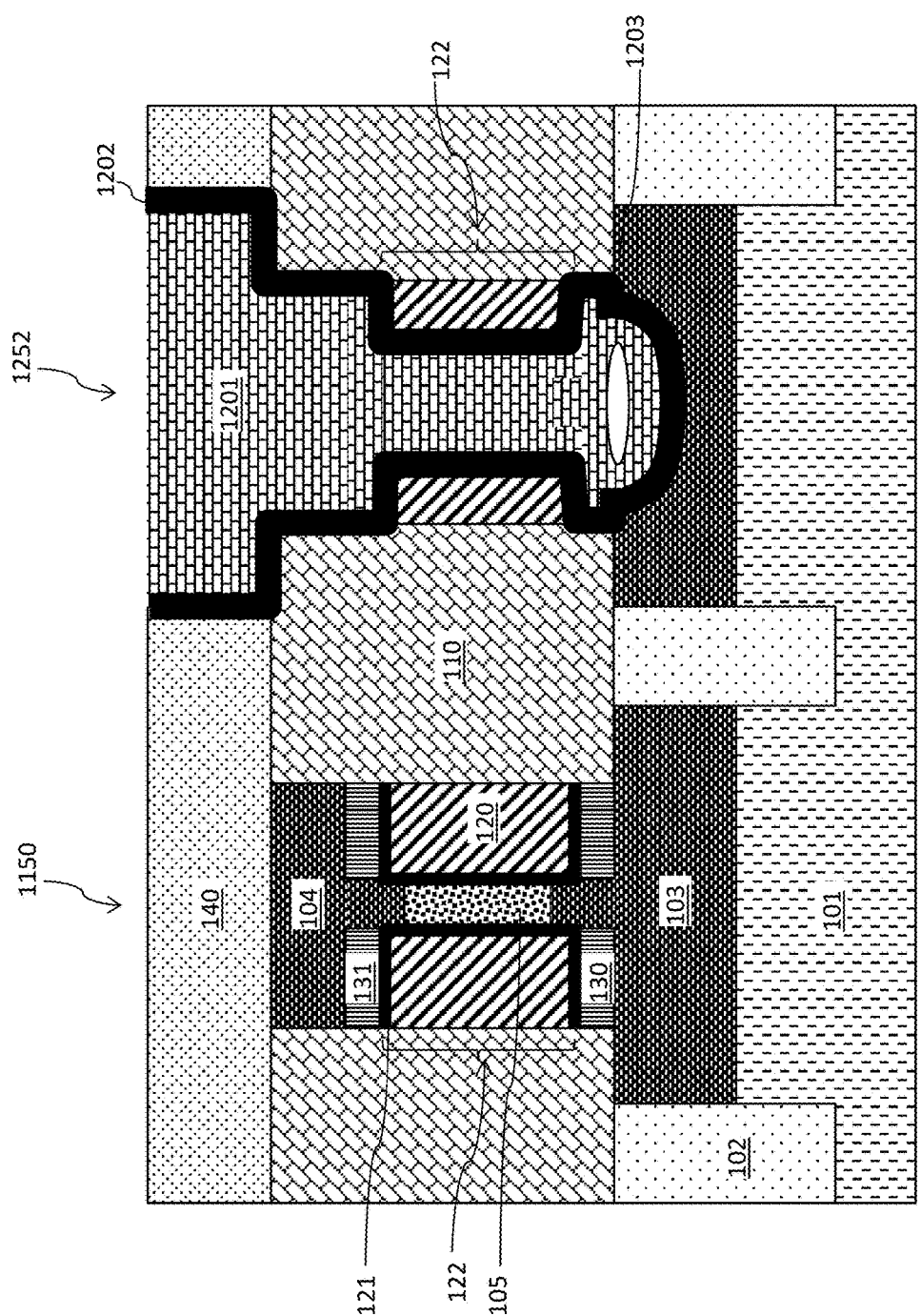

FIGS. 11-12B illustrate an exemplary process flow for making a vertical transistor and a MIM capacitor on the same chip according to embodiments, in which a wider fin in the MIM capacitor region 1151 accommodates a thicker dielectric material layer and metal fill. The transistor region 1150 includes a fin that is narrower than the MIM capacitor region 1151 for optimal electrostatics.

FIG. 11 is a cross-sectional side view of a MIM capacitor region 1151 having a wider fin 1152 than the vertical transistor 1150. As a starting structure, adjacent identical vertical transistors can be formed as described in the above embodiments, except that the MIM capacitor region 1151 is formed with a fin 1152 that is wider than fin 105.

The fin 105 of the transistor 1150 is thinner than the fin 1152 of the MIM capacitor region 1151. In embodiments, the width of fin 105 of the transistor 1150 is in a range from about 3 nm to about 12 nm, and the thickness of the wider fin 1152 of the MIM capacitor region 1151 is in a range from about 8 nm to about 40 nm.

FIG. 12A is a cross-sectional side view after removing the source/drains (top and bottom source/drain regions 104, 103, fin 105, and top and bottom spacers 131, 130 and then depositing a thick dielectric 1202 and metal 1201 to form MIM capacitor 1251 according to an embodiment. A bottom-up deposition process described with reference to FIG. 10A can be used. The MIM capacitor 1251 (metal-insulator-metal) includes new metal 1201, thick dielectric layer 1202, and metal gate 120. The width of the fin 105 of the transistor 1150 is less than a width of the metal extending through the gate of the MIM capacitor 1251. In embodiments, the thick dielectric layer 1202 is a high-k dielectric material layer. The processes and structures described with reference to FIG. 10A above can be used.

FIG. 12B is a cross-sectional side view after removing the source/drains (top and bottom source/drain regions 104, 103, fin 105, and top and bottom spacers 131, 130 and then depositing a thick dielectric 1202 and metal 1201 to form MIM capacitor 1252 according to an embodiment. A conformal deposition process described with reference to FIG. 10B can be used. A void 1203 is formed beneath previously removed fin channel region. The MIM capacitor 1252 (metal-insulator-metal) includes new metal 1201, thick dielectric layer 1202, and metal gate 120. In embodiments, the thick dielectric layer 1202 is a high-k dielectric material layer. The processes and structures described with reference to FIG. 10B above can be used.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A device comprising a transistor and a capacitor on a same substrate, the device comprising:
   a transistor comprising a channel extending from a bottom source/drain to a top source/drain, and a gate arranged around the channel; and
   a capacitor comprising a gate arranged over the bottom source/drain, and a metal arranged in a depression in the bottom source/drain and extending through a channel in the gate to cover the gate.

2. The device of claim 1, wherein the gate of the transistor comprises a dielectric layer.

3. The device of claim 2, wherein the dielectric layer of the gate of the transistor is a high-k dielectric layer.

4. The device of claim 2, wherein the gate of the capacitor comprises a dielectric layer.

5. The device of claim 4, wherein the dielectric layer of the capacitor is thicker than the dielectric layer of the transistor.

6. The device of claim 4, wherein the dielectric layer of the transistor is a different material than the dielectric layer of the capacitor.

7. The device of claim 4, wherein the dielectric layer of the capacitor lines the depression within the bottom source/drain.

8. The device of claim 4, wherein the dielectric layer of the gate of the capacitor is a high-k dielectric layer.

9. The device of claim 4, wherein the dielectric layer of the capacitor is thicker than a thickness of the dielectric layer of the transistor.

10. The device of claim 9, wherein a width of the channel of the transistor is in a range from about 3 nm to about 12 nm, and a width of the channel of the capacitor is in a range from about 8 nm to about 40 nm.

11. The device of claim 1 further comprising a void between the gate and the bottom source/drain in the metal of the capacitor.

12. The device of claim 1, wherein a width of the channel of the transistor is less than a width of the metal extending through the gate of the capacitor.

13. The device of claim 1, wherein a width of the channel of the transistor is in a range from about 3 nm to about 12 nm.

14. The device of claim 1, wherein a width of the channel of the capacitor is in a range from about 8 nm to about 40 nm.

15. A device comprising a transistor and a capacitor on a same substrate, the device comprising:
- a transistor comprising a bottom source/drain, a channel extending from the bottom source/drain to a top source/drain, and a gate arranged around the channel; and
- a capacitor comprising a gate arranged over the bottom source/drain, and a metal arranged in a depression in the bottom source/drain and extending through a channel in the gate to cover the gate, the metal directly contacting a portion of the gate;
- wherein a width of the channel of the transistor is less than a width of the channel of the capacitor.

16. The device of claim 15, wherein the capacitor is a MIM capacitor.

17. The device of claim 15, wherein the transistor is a vertical transistor.

18. The device of claim 15 further comprising a void between the gate and the bottom source/drain in the metal of the capacitor.

19. The device of claim 15, wherein the transistor and the capacitor each include a dielectric layer.

20. The device of claim 19, wherein the dielectric layer of the transistor is a different material than the dielectric layer of the capacitor.

* * * * *